(12) United States Patent
Ross

(10) Patent No.: US 10,344,744 B2
(45) Date of Patent: Jul. 9, 2019

(54) ENERGY PRODUCTION FROM WASTE HEAT USING A SHAPE MEMORY DRIVE OR HEAT ENGINE

(71) Applicant: Amazon Technologies, Inc., Seattle, WA (US)

(72) Inventor: Peter George Ross, Olympia, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/925,661

(22) Filed: Mar. 19, 2018

(65) Prior Publication Data

US 2018/0209404 A1    Jul. 26, 2018

Related U.S. Application Data

(63) Continuation of application No. 14/733,813, filed on Jun. 8, 2015, now Pat. No. 9,920,750.

(51) Int. Cl.
| | |
|---|---|
| *F01K 3/18* | (2006.01) |
| *H05K 7/20* | (2006.01) |
| *F03G 7/06* | (2006.01) |
| *G06F 1/20* | (2006.01) |
| *H02K 7/00* | (2006.01) |
| *H02K 7/18* | (2006.01) |
| *G06F 1/26* | (2006.01) |

(52) U.S. Cl.
CPC .............. *F03G 7/065* (2013.01); *F01K 3/185* (2013.01); *G06F 1/20* (2013.01); *G06F 1/26* (2013.01); *H02K 7/00* (2013.01); *H02K 7/1853* (2013.01); *H05K 7/208* (2013.01); *H05K 7/20745* (2013.01); *G06F 2200/201* (2013.01); *Y02E 20/14* (2013.01)

(58) Field of Classification Search
CPC ...... G06F 1/20; G06F 1/206; G06F 2200/201; H05K 7/2029; H05K 7/20663; H05K 7/208; F01K 23/02; F01K 3/185; F25B 27/02
See application file for complete search history.

(56) References Cited

U.S. PATENT DOCUMENTS

| | | | | |
|---|---|---|---|---|
| 3,316,415 | A | * | 4/1967 | Taylor ................... H02N 10/00 290/1 R |
| 3,403,238 | A | | 9/1968 | Buehler et al. |
| 3,699,769 | A | | 10/1972 | Bondurant |
| 4,030,298 | A | | 6/1977 | Sandoval |

(Continued)

OTHER PUBLICATIONS

Jillcha Fedaku Wakjira, "The VT1 Shape Memory Alloy Heat Engine Design", Jan. 2001, pp. 1-98, Blacksburg, Virginia.

(Continued)

*Primary Examiner* — Vanessa Girardi
(74) *Attorney, Agent, or Firm* — Robert C. Kowert; Meyertons, Hood, Kivlin, Kowert & Goetzel, P.C.

(57) ABSTRACT

A data center includes computing devices, an air handling system, a heat engine, and a generator. Air moved by the air handling system flows across heat-producing components in the computing devices in the data center. Heat from air that has flowed over the heat-producing components heats a hot section of the heat engine. The heat engine generates mechanical work based on a temperature differential between a hot section of the heat engine and a cold section of the heat engine. The generator generates electricity from the mechanical work generated by the heat engine.

17 Claims, 8 Drawing Sheets

(56) References Cited

U.S. PATENT DOCUMENTS

| | | | |
|---|---|---|---|
| 4,938,026 | A | 7/1990 | Goldstein |
| 4,996,842 | A | 3/1991 | Goldstein |
| 8,511,082 | B2 | 8/2013 | Browne et al. |
| 8,522,569 | B2 | 9/2013 | Avery et al. |
| 8,607,562 | B2 | 12/2013 | Browne et al. |
| 8,844,281 | B2 * | 9/2014 | Browne .................. F03G 7/06 148/402 |
| 9,038,379 | B2 | 5/2015 | Alexander et al. |
| 9,920,750 | B1 | 3/2018 | Ross |
| 2005/0078447 | A1 | 4/2005 | Hamann et al. |
| 2011/0140456 | A1 | 6/2011 | Wittorf et al. |
| 2013/0163193 | A1 | 6/2013 | Ballantine et al. |

OTHER PUBLICATIONS http://www.imagesco.com/articles/nitinol/09.html, "Nitinol Heat Egines", Downloaded May 7, 2015, pp. 1-4.

U.S. Appl. No. 13/864,175, filed Apr. 16, 2013, Brock Robert Gardner et al.

U.S. Appl. No. 13/632,766, filed Oct. 1, 2012, Michael P. Czamara, et al.

U.S. Appl. No. 13/659,644, filed Oct. 24, 2012, Brock Robert Gardner, et al.

* cited by examiner

ENERGY PRODUCTION FROM WASTE HEAT USING A SHAPE MEMORY DRIVE OR HEAT ENGINE

This application is a continuation of U.S. patent application Ser. No. 14/733,813, filed Jun. 8, 2015, now U.S. Pat. No. 9,920,750, which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data centers rely on forced air systems and air conditioning to maintain the temperatures and other environmental conditions in the data center within acceptable limits. The initial and ongoing costs of installing and operating these systems may add substantial cost and complexity to data center operations. A considerable amount of energy in the form of waste heat may be rejected to a surrounding environment by forced air or air conditioning systems in many data centers.

Data centers often include components and systems to provide back-up power to servers in the event of a failure of components or systems in a primary power system. Providing full redundancy of electrical power for a data center may, however, be costly both in terms of capital costs (in that in may require a large number of expensive switchboard, UPSs, and PDUs, for example) and in terms of costs of operation and maintenance.

Figure 1:
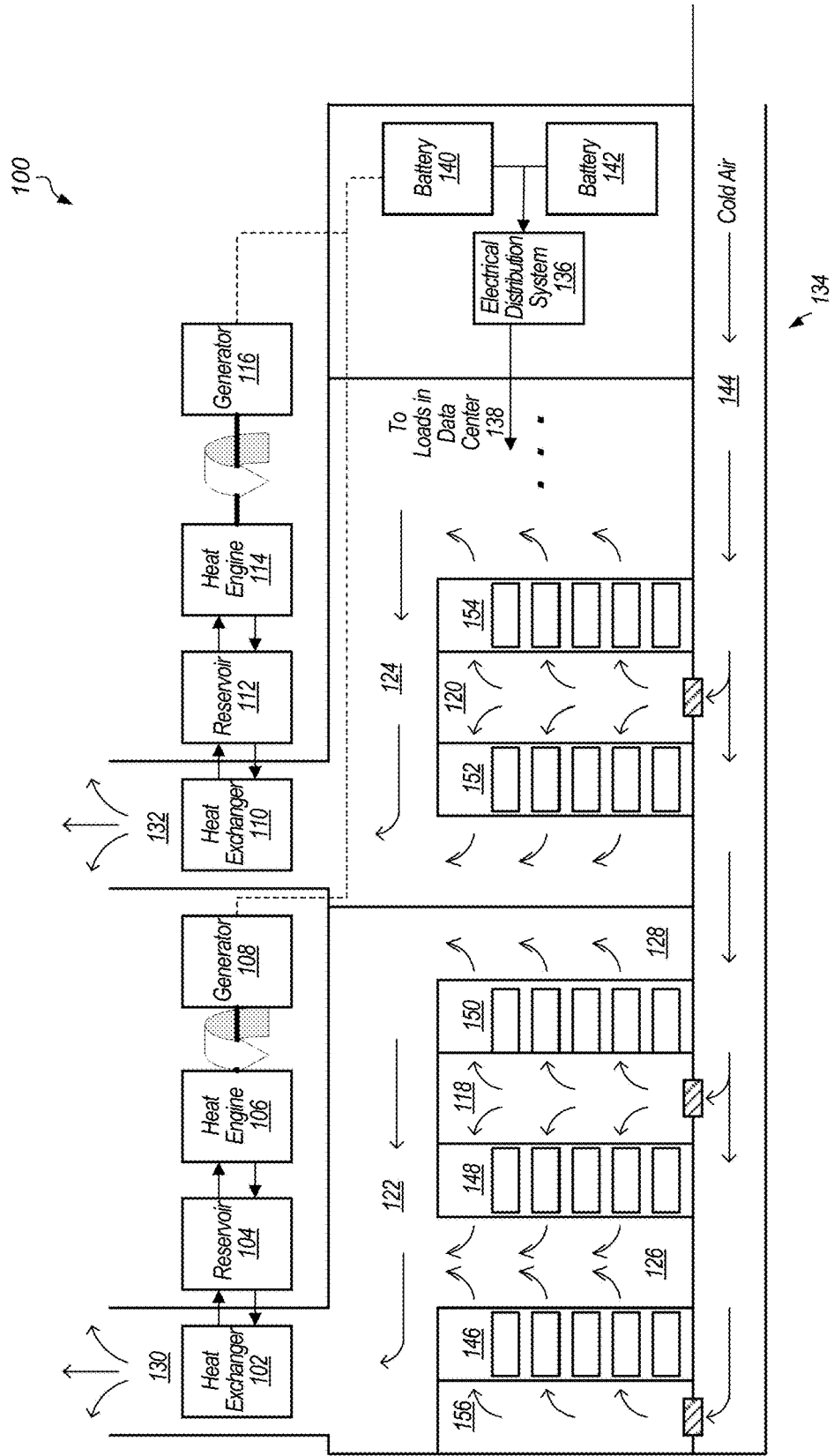
FIG. 1 is a block diagram illustrating a data center that includes a system for reclaiming energy from cooling systems, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for reclaiming energy from cooling systems are disclosed. According to one embodiment, a data center includes multiple computing devices and an air handling system configured to move air. At least a portion of the air moved by the air handling system flows across heat-producing components in at least some of the computing devices in the data center. For example, an air handling system may cause air to flow over processors, storage devices, or other heat-producing components of computer systems. The air handling system includes one or more exhaust vents that direct exhaust air to an ambient environment outside of the data center and the exhaust air is heated by the heat-producing components in at least some of the computing devices in the data center. The data center also includes a heat engine that includes a hot section that is heated by the exhaust air, a cool section at a lower temperature than the hot section, and one or more shape memory elements coupled to a shaft. The heat engine is configured such that the one or more shape memory elements are deformed when passing through the cool section and recover to a pre-deformation shape when passing through the hot section, wherein a force produced by the one or more shape memory elements recovering to the pre-deformation shape when passing through the hot section causes the shaft to rotate. A generator is coupled to the shaft of the heat engine, wherein the generator is configured to generate electricity.

According to one embodiment, a system includes an air handling system configured to move air through an enclosure, wherein at least a portion of the air moved by the air handling system flows across heat-producing electrical components in the enclosure. The system also includes a heat engine that includes a hot section that is heated by the air that has flowed across the heat-producing electrical components in the enclosure, a cool section at a lower temperature than the hot section, and a drive configured to generate mechanical work based on a temperature differential between the hot section and the cool section of the heat engine. The system includes a generator coupled to the drive of the heat engine, wherein the generator is configured to generate electricity from mechanical work of the drive.

According to one embodiment, air is passed over one or more heat-producing components in a data center to remove heat energy from the one or more heat-producing components. A hot section of a heat engine is heated by the air that has passed over the heat-producing components, wherein the heat engine includes the hot section, a cool section at a lower temperature than the hot section, and one or more drives. The heat engine generates mechanical work in the one or more drives based on a temperature differential between the hot section of the heat engine and the cool section of the heat engine. Electrical power is generated from the mechanical work generated by the heat engine.

As used herein, "air handling system" means a system that provides or moves air to, or removes air from, one or more systems or components.

As used herein, "duct" means a tube, channel, pipe, or fluid carrier that can direct or channel a gas, such as air, from one location to another. A duct may have any cross section, including square, rectangular, circular, ovate, or irregular. A duct may have a uniform cross sectional area over its length or a varying cross sectional area over its length. A duct may, for example, include a converging section in which the cross sectional area of the duct decreases, a diverging section in which the cross sectional area of the duct increases, or both.

As used herein, "exhaust" means air that is being exhausted or expelled from an air handling system (for example, to outside air).

As used herein, "infrastructure" means systems, components, or elements of a system that provide resources for a computing device, such as electrical power, data exchange capability with external systems, air, heat removal, and environmental control (for example, humidity control, particulate control).

As used herein, an "aisle" means a space next to one or more racks.

As used herein, "ambient" refers to a condition of outside air at the location of a system or data center. An ambient temperature may be taken, for example, at or near an intake hood of an air handling system.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "hot aisle" means an aisle into which heated air can be discharged for use in removing heat from a system, such as a rack computing system.

As used herein, "rack computing systems" means a computing system that includes one or more computing devices mounted in a rack.

As used herein, "reserve power" means power that can be supplied to an electrical load upon the failure of, or as a substitute for, primary power to the load.

As used herein, "room" means a room or a space of a building. As used herein, "computer room" means a room of a building in which computing devices, such as rack-mounted servers, are operated.

In various embodiments, a system includes a heat engine coupled to a generator that generates electricity from waste heat from a cooling system. FIG. 1 is a block diagram illustrating one embodiment of a data center including a system for reclaiming energy from a cooling system. A cooling system may include an air handling system that causes air to flow through heat-producing components that are to be cooled by the cooling system. A cooling system may also include one or more systems for cooling air that flows through an air handling system, such as an evaporative cooler, a mechanical cooler, or other type of cooler. For example data center 100 includes cooling system 134 comprising air handling system 144 and may include one or more coolers (not shown). Air flowing through an air handling system of a cooling system, such as air flowing through air handling system 144 of cooling system 134, may remove heat from heat-producing components, such as computer devices mounted in racks 146, 148, 150, 152 and 154 in data center 100. FIG. 1 illustrates a cooling system that includes an air handling system that distributes air from an underfloor plenum. However, in some embodiments a system for reclaiming energy from a cooling system may include an air handling system with overhead ducts, or other suitable means to convey cooling air so that cooling air flows through heat-producing components in a data center.

An air handling system may cause cool air to pass over heat-producing components, such as computer devices mounted in a rack in a data center, to cool the heat-producing components. For example, air handling system 144 directs cooling air into cold aisle 156 where cooling air flows through heat-producing components mounted in rack 146, such as computer devices mounted in rack 146. Heated air then flows into hot aisle 126. Air handling system 144 also directs cooling air into cold aisle 118 where the cooling air flows through heat-producing components mounted in rack 148 and rack 150. Heated air then flows into hot aisle 128. Heated air in hot aisle 126 and hot aisle 128 combine in exhaust plenum 122 and flow to vent 130. In a similar manner, air handling system 144 directs cooling air into cold aisle 120 to cool racks 152 and 154. Heated air combines in exhaust plenum 124 and flows to vent 132. FIG. 1 illustrates an example embodiment that utilizes hot aisles and cold aisles as part of a cooling system, however in some embodiments a data center including a system for reclaiming energy from a cooling system may use other cooling system configurations. For example a data center that includes a system for reclaiming energy from a cooling system may include ducts coupled to a top portion of a rack where cooling air enters through a bottom portion of the rack and heated air exits from the top portion of the rack into the ducting. In some embodiments, other aisle configurations and/or air handling supply and exhaust configurations may be used. Ellipses are shown in data center 100 to indicate that a data center, such as data center 100, may include more or less racks in a computer room and may include more or less computer rooms. The additional racks and additional computer rooms may be supplied cooling air by one or more air handling systems and systems for reclaiming energy from cooling systems may be used to reclaim waste heat from the one or more air handling systems.

A system for reclaiming energy from a cooling system may use air flowing in an air handling system that has been heated by heat-producing components to heat a hot section of a heat engine. In some embodiments, a heat exchanger and reservoir may be used to transfer heat from heated air flowing in an air handling system to a hot section of a heat engine. For example, heat exchanger 102 is mounted such that heated air flowing out of vent 130 passes over heat exchanger 102. A heat exchanger may be coupled to a reservoir, for example heat exchanger 102 is coupled to reservoir 104, and heat exchanger 110 is coupled to reservoir 112. A reservoir may contain a heat transfer fluid that flows through a heat exchanger to remove heat from heated air flowing over the heat exchanger. For example reservoir 104 may contain a heat transfer fluid that flows through heat exchanger 102 and removes heat from heated air flowing in vent 130 and reservoir 112 may contain a heat transfer that flows through heat exchanger 110 and removed heat from heated air flowing in vent 132. A heat transfer fluid may be water, ethylene glycol, mineral oil, or other suitable heat transfer fluid.

A reservoir may be connected to a heat exchanger such that a heat transfer fluid passively flows through a heat exchanger mounted in an exhaust vent without mechanical work being done on the heat transfer fluid. For example, a reservoir may be connected to a heat exchanger in an exhaust vent such that the reservoir and the heat exchanger function as a thermal syphon. A thermal syphon may cause a fluid to circulate based on a temperature differential. For example, a hot fluid may have a lower density than a cold fluid, so that as a fluid is heated the heated fluid naturally rises compared to the cold fluid. As described in more detail in regard to FIG. 3, a reservoir may be connected to a heat exchanger such that a heat transfer fluid in the reservoir circulates through a heat exchanger connected to the reservoir due to differences in densities caused by temperature differences in the heat transfer fluid. In FIG. 1, reservoir 104 is coupled to heat exchanger 102 such that a heat transfer fluid in reservoir 104 is circulated through heat exchanger 102 by a thermal syphoning effect.

A reservoir may also be connected to a heat engine such that heated heat transfer fluid passively flows through a hot section of the heat engine to heat the hot section of the heat engine with mechanical work being performed on the heat transfer fluid. A thermal syphoning effect can be used to circulate a heated heat transfer fluid through a hot section of a heat engine without performing mechanical work on the heat transfer fluid. For example, heat engine 106 is coupled to reservoir 104 such that a heat transfer fluid in reservoir 104 passively flows through the hot section of heat engine 106 to heat the hot section of heat engine 106.

In some embodiments, a heat transfer fluid may be circulated through a heat exchanger and/or hot section of a heat engine via mechanical means, such as a pump. A pump may be used to initialize circulation and later be turned off once circulation is established. For example, it may be necessary to use mechanical work to start circulation, but a thermal syphon effect as described above may be sufficient to cause heat transfer fluid from a reservoir to continue to circulate through a heat exchanger and a hot section of a heat engine without additional mechanical work being performed on the heat transfer fluid once circulation is established.

A temperature difference between a hot section and a cool section of a heat engine may be utilized to generate mechanical work in a drive of a heat engine. For example, a heat engine may utilize a shape memory alloy to generate mechanical work. A shape memory alloy may have a material property such that the shape memory alloy can be deformed at a first temperature and when heated to a second temperature recover to its pre-deformation shape. When the shape memory alloy recovers to its pre-deformation shape it may exert a force that can be used to generate mechanical work. For example, a shape memory alloy may be in the shape of a wire or band. The wire or band may be deformed at a first temperature. When heated to a second temperature the wire or band made of the shape memory alloy may recover to its pre-deformation shape. When the shape memory alloy recovers to its pre-deformation shape it may exert a torsional force on a disc the shape memory alloy band is in contact with. The torsional force may be used to generate mechanical work. For example a torsional force exerted by a shape memory alloy when recovering to its pre-deformation shape may be used to turn a shaft. A shape memory alloy may be alternately heated and cooled such that it repeatedly generates torsional forces that can cause a shaft to rotate.

In some embodiments, a shape memory alloy may be an alloy of nickel and titanium commonly known as Nitinol. In some embodiments, other suitable shape memory alloys may be used such as alloys of copper, aluminum and nickel; alloys of zinc, copper, gold, and iron, or other shape memory alloys that have a material property such that the shape memory alloy recovers to a pre-deformation shape when heated thus exerting a force on objects in contact with the shape memory alloy.

In some embodiments, other types of heat engines may be used to generate mechanical work based on a temperature differential between a hot section and a cold section of the heat engine. For example a turbine system may be used that utilizes a working fluid with a low boiling point such that heated air from a cooling system causes the working fluid to change phases from liquid to vapor in a hot section of the heat engine. Expansion of the working fluid as it changes phases from liquid to vapor may cause a rotor of a turbine of a heat engine to rotate. After passing through a turbine, the working fluid may be condensed into a liquid in a cool section of a heat engine. The condensed working fluid may then be transferred to a hot section of a heat engine where the working fluid is heated and changes phase back to a vapor. The cycle of evaporating and condensing the working fluid may be repeated to generate mechanical work based on the temperature differential between a hot section and a cold section of a heat engine. A turbine may be coupled to a generator that generates electrical power from mechanical work generated by the turbine.

Electrical power generated by a generator coupled to a heat engine may be used to supplement an electrical feed to loads in a data center. For example, generator 108 coupled to heat engine 106 and generator 116 coupled to heat engine 114 may supply electrical power to electrical distribution system 136 that is coupled to loads 138 in data center 100. In some embodiments, one or more energy storage devices, such as batteries 140 and 142, may be used to store electrical power generated by generators coupled to heat engines, such as generators 108 and 116. Energy storage devices may be used to store electrical power and supply electrical power to loads in a data center based on conditions in a data center and external factors. For example, electrical power stored in energy storage devices, such as batteries 140 and 142, may be used to provide reserve power for one or more loads in a data center. Electrical power stored in energy storage devices, such as batteries 140 and 142, may also be used to supplement a separate uninterruptible power supply for one or more loads in a data center. In some embodiments, electrical power stored in energy storage devices, such as batteries 140 and 142, may be used to supplement electrical power received by a data center from a utility power provider. For example, it may be desirable to supplement electrical power received form a utility power provider during peak energy consumption intervals. A utility power provider may charge higher prices for electrical power received by a data center during intervals of peak energy consumption. Electrical power stored in an energy storage system, such as batteries 140 and 142, may be used to supplement electrical power received from a utility power provider during peak energy consumption intervals, thus lowering the overall amount and cost of energy received by the data center from the utility provider during intervals of peak energy consumption.

Figure 2A:
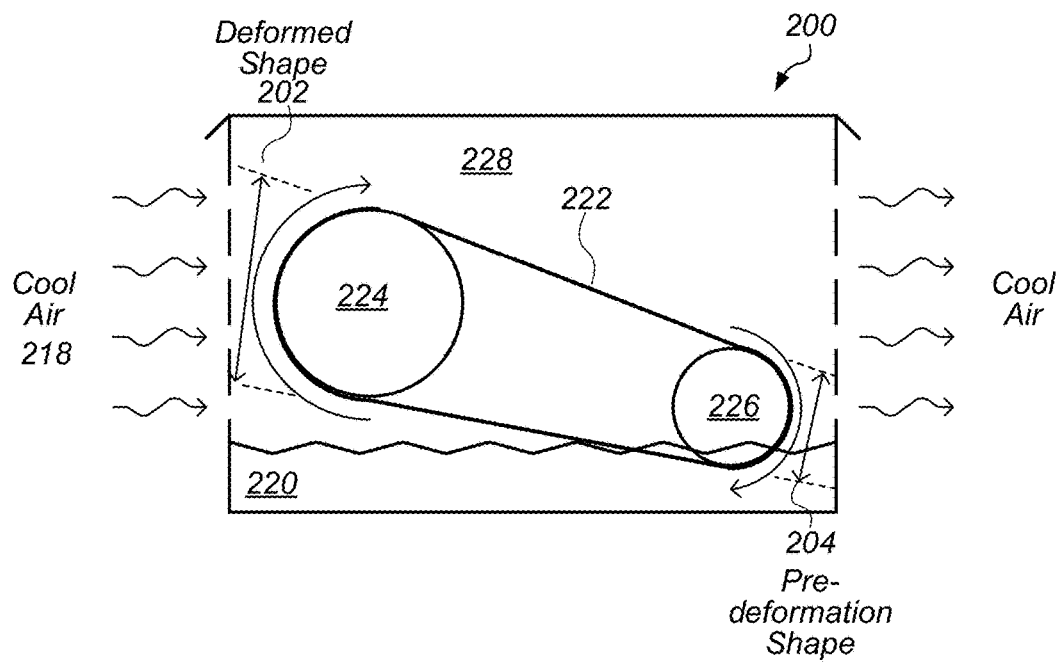
FIG. 2A illustrates a heat engine that is part of a system for reclaiming energy from cooling systems, according to some embodiment.
Figure 2B:
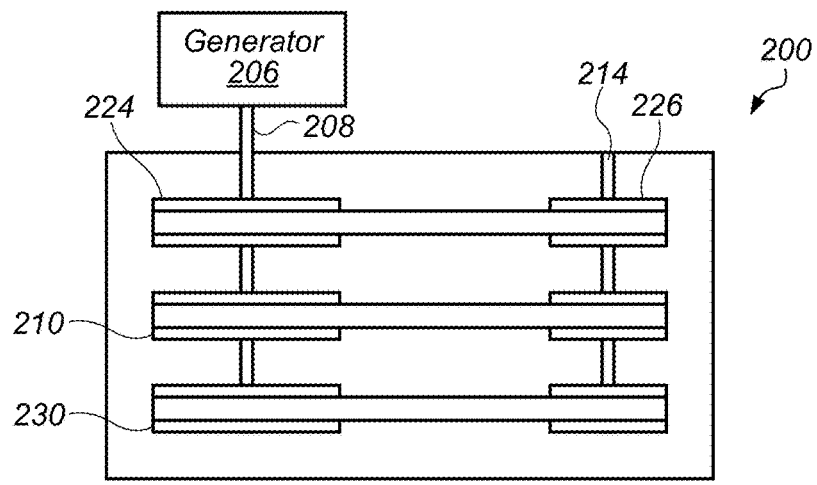
FIG. 2B illustrates a heat engine coupled to a generator that is part of a system for reclaiming energy from cooling systems, according to some embodiments.

FIGS. 2A and 2B illustrate a heat engine with shape memory alloy bands or wires coupled to a generator that may be included in a system for reclaiming energy from cooling systems, according to some embodiments. A shape memory alloy may have a material property such that the shape memory alloy can be deformed at a first temperature and when heated to a second temperature recover to its pre-deformation shape. When the shape memory alloy recovers to its pre-deformation shape it may exert a force that can be used to generate mechanical work. For example, heat engine 200 includes shape memory alloy band 222 that is in the form of a belt or wire stretched around discs 224 and 226. Heat engine 200 includes hot section 220 that includes a heated heat transfer fluid and cool section 228 that receives cool air 218. In some embodiments, cool air 218 may be ambient air or may be air cooled by a cooling system of a data center. Discs 224 and 226 are configured in heat engine 300 such that shape memory alloy band 222 is partially deformed (e.g. stretched or elongated). For example a length of shape memory alloy band 222 is stretched in cool section 228 about disc 224. When heat is added to the shape memory alloy band 222 in hot section 220, the portion 204 of shape memory alloy band 222 that is in hot section 220 and in contact with disc 226 recovers to a pre-deformation shape (e.g. recovers to a pre-stretched length). This causes a torsional force on disc 226 which in turn causes disc 226 to rotate. As disc 226 rotates portion 202 of shape memory alloy band 222 in cool section 228 is deformed (e.g. stretched). As a portion of a shape memory alloy band that is in a cool section is deformed and a portion of the shape memory alloy band in a hot section recovers to a pre-deformation shape, a resulting force can cause discs, such as discs 224 and 226, to rotate.

FIG. 2B shows a top view of heat engine coupled to a generator that is part of a system for reclaiming energy from cooling systems, according to some embodiments. Heat engine 200 is coupled to generator 206. Discs 224 and 226 in FIG. 2B may be the same discs 224 and 226 illustrated in FIG. 2A. Disc 224 is mounted on shaft 208 and disc 226 is mounted on shaft 214. Shaft 208 is coupled to generator 206. In some embodiments, multiple sets of shape memory alloys and discs may be coupled to the same shaft. For example, heat engine 200 includes additional shape memory alloy bands and associated discs 210 and 230. In some embodiments more or less sets of shape memory alloy bands and associated discs may be coupled to a shaft of a heat engine.

In some embodiments, heat engines may be configured into modules with more than one heat engine coupled to a vent of a data center. For example, multiple heat engines 200 may be coupled to a single vent. A modular configuration may permit individual components such as shape memory alloy bands 222 to be replaced in a particular heat engine while other heat engines continue to operate. In some embodiments, multiple heat engines are coupled to a common generator. For example, generator 206 may be coupled to multiple heat engines 200. In some embodiments, a heat engine may be another type of engine that can generate mechanical work based on a temperature differential between a hot section and cold section, such as a turbine system with a low boiling point working fluid.

In some embodiments, a heat engine may include a shape memory alloy band that is a chain and discs of a heat engine may be sprockets configured to engage with the chain. In some embodiments other systems may be used to convert a force exerted by a shape memory alloy into mechanical work.

Figure 3:
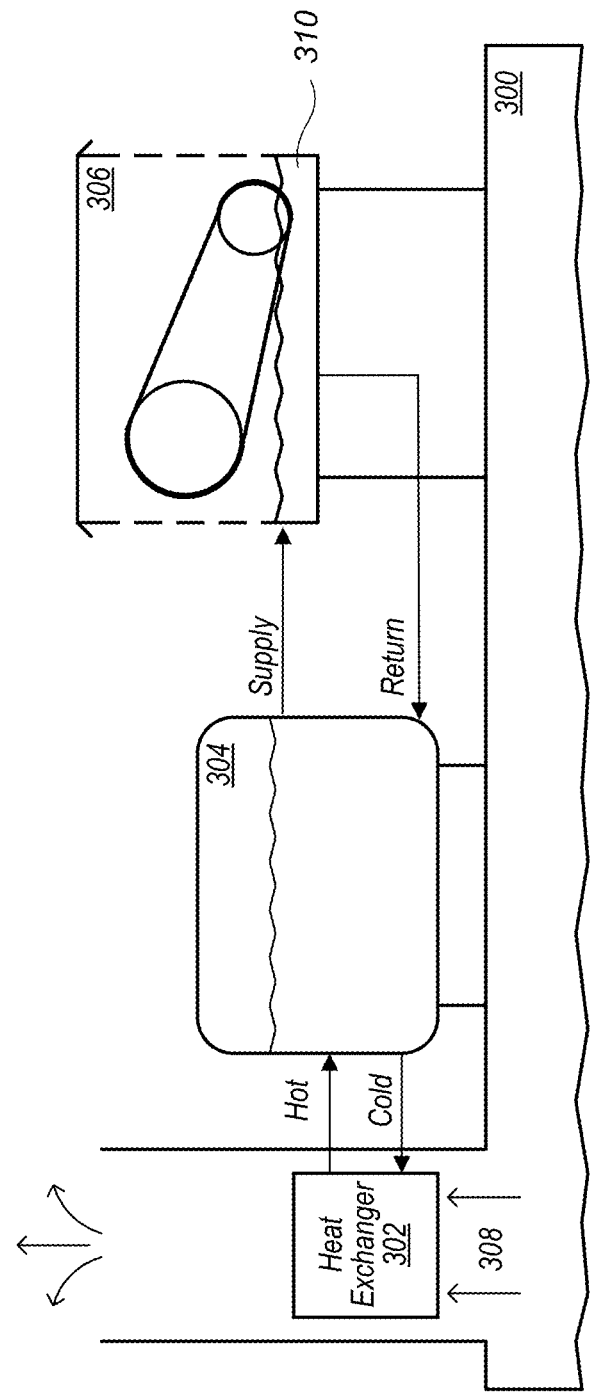
FIG. 3 illustrates a heat engine that is coupled to a reservoir and heat exchanger that is part of a system for reclaiming energy from cooling systems, according to some embodiments.

FIG. 3 illustrates a heat engine heated by a reservoir and heat exchanger included in a system for reclaiming energy from cooling systems, according to some embodiments. A heat exchanger, such as heat exchanger 302, may be placed in a flow of heated air, such as heated air 308 from data center 300. A heat exchanger may be coupled to a reservoir, such as reservoir 304, such that an inlet to the heat exchanger receives heat transfer fluid from a bottom portion of the reservoir and returns heated heat transfer fluid to a top portion of the reservoir. As heated air, such as heated air 308, flows over a heat exchanger, such as heat exchanger 302, the heated air may heat heat transfer fluid in the heat exchanger. As the heat transfer fluid in the heat exchanger is heated, it may become less dense and thus be comparatively lighter than cool heat transfer fluid that has a higher density. The differences in densities between the heated heat transfer fluid and the cool heat transfer fluid may cause the heated heat transfer fluid to rise within the heat exchanger and ultimately to flow back to a top portion of the reservoir. The heated heat transfer fluid flowing back to the top portion of the reservoir may then displace an amount of cool heat transfer fluid in a lower portion of the reservoir causing the cool heat transfer fluid to flow into the heat exchanger and be heated by the heated air passing over the heat exchanger. The circulation of a heat transfer fluid based on density differences of the heat transfer fluid at different temperatures may be referred to as a thermal syphoning effect.

A hot section of a heat engine may also be coupled to a top portion of a reservoir and receive heated heat transfer fluid from the reservoir. For example, hot section 310 of heat engine 306 receives heated heat transfer fluid from top portion of reservoir 304. The hot section of a heat engine may also be coupled to a bottom portion of a reservoir and return heat transfer fluid to the reservoir. A similar thermal syphon effect as described in regards to a heat exchanger coupled to a reservoir may also cause a heat transfer fluid to circulate from a top portion of a reservoir to a hot section of a heat engine. As the heat transfer fluid in the hot section of a heat engine cools it may become denser than heated heat transfer fluid in a reservoir coupled to the hot section of the heat engine, such as reservoir 304 coupled to heat engine 306. The denser heat transfer fluid in the hot section of the heat engine may flow back to the reservoir displacing a portion of the heat transfer fluid in the reservoir and causing heated heat transfer fluid to flow into the hot section of the heat engine.

In some embodiments, heat transfer fluid may passively circulate through a heat exchanger and a hot section of a heat engine without mechanical work being performed on the heat transfer fluid to cause the heat transfer fluid to circulate. In some embodiments mechanical work may be performed on the heat transfer fluid to establish circulation. For example, one or more pumps may be used to establish circulation through a heat exchanger and may subsequently be turned off, once flow is established.

In some embodiments, a reservoir, such as reservoir 304 may include one or more baffles to facilitate passive circulation of a heat transfer fluid between the reservoir and a heat exchanger and the reservoir and a hot section of a heat engine. In some embodiments, a heat exchanger, a reservoir, and a hot section of a heat engine may be configured at equivalent elevations so that gravitational effects do not prevent passive circulation of a heat transfer fluid.

Figure 4:
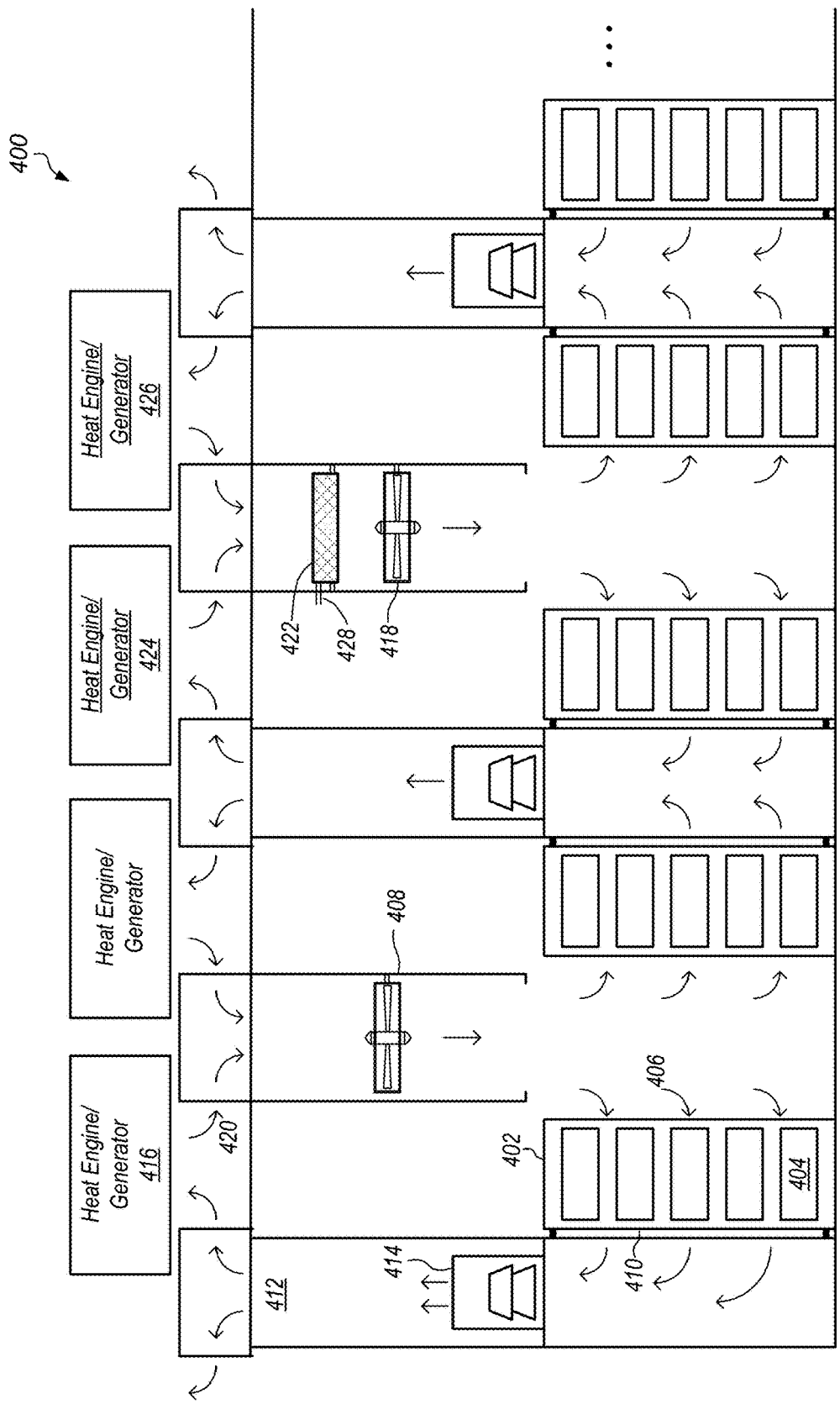
FIG. 4 is a block diagram illustrating a data center that includes a system for reclaiming energy from cooling systems, according to some embodiments.

FIG. 4 illustrates a data center including a system for reclaiming energy from cooling systems, according to some embodiments. In some embodiments, a hot section of a heat engine may be heated by heated air from a cooling system of a data center without using a heat exchanger connected to a reservoir. In some embodiments, a system for reclaiming energy from a cooling system may include multiple exhaust vents with heat engines coupled in respective exhaust events. For example, data center 400 includes racks 402 comprising computer systems 404 that receive inlet cooling air 406 from inlet fans 408 and 418. Cooling air 406 passes over heat-producing components in computer systems 404 in racks 402 and leaves racks 402 as heated air 410. Heated air 410 is exhausted out vent 412 by exhaust fan 414. Heat engine 416 is mounted such that heated air 410 from vent 412 passes over a hot section of heat engine 416 and cool air 420 being drawn into data center 400 by inlet fan 408 passes over a cool section of heat engine 416. Heat engine 416 may be a shape memory alloy heat engine, a low boiling point working fluid turbine, or other heat engine configured to generate mechanical work based on a temperature differential between a hot section of the heat engine and a cool section of the heat engine.

In some embodiments, the cool section of a heat engine may be cooled by air that is supplied to an evaporative cooling system. Because evaporative cooling systems are based on cooling air by using the latent heat of vaporization of water, depending upon atmospheric conditions an evaporative cooler may be able to dissipate additional heat that is added to air flowing into an evaporative cooler by a heat engine without substantially increasing the outlet air temperature of the evaporative cooler. For example, assuming that the relative humidity in a given location is such that ambient air has the capacity to hold additional water vapor, an evaporative cooler may dissipate additional heat added to inlet air to the evaporative cooler by a heat engine by evaporating additional water in the evaporative cooler. An evaporative cooler that receives air that has passed through a cool section of a heat engine may be part of a cooling system of a data center. For example, evaporative cooler 422 is mounted upstream of inlet fan 418. Heat engines 424 and 426 are mounted such that air drawn into evaporative cooler 422 by inlet fan 418 passes through the cool sections of heat engines 424 and 426. Water is supplied to evaporative cooler 422 by water inlet 428. As explained above, depending on atmospheric conditions, such as relative humidity, additional heat added to air flowing into evaporative cooler 422 by heat engines 424 and 426 may not increase the outlet temperature of air that has passed through evaporative cooler 422. Additional water from water inlet 428 may be evaporated in evaporative cooler 422 to maintain an outlet temperature of evaporative cooler 422, such that heat from heat engines 424 and 426 do not increase the temperature of air supplied to data center 400 via evaporative cooler 422. Air flowing into an inlet of an evaporate cooler, such as evaporative cooler 422, may be used to cool a cool section of a heat engine to generate a greater temperature differential in the heat engine and thus generate more mechanical work from the heat engine, without significantly affecting a cooling system's ability to cool, where the cooling system uses the evaporative cooler as a chiller to chill air in the cooling system.

FIG. 4 illustrates an example configuration using evaporative coolers, however one skilled in the art will appreciate that a cool section of a heat engine may be cooled by any source of cool air that is being drawn into a data center, such as an air intake to a mechanical air conditioning system, an air intake to a free cooling system, or other duct that flows cool air. In some embodiments, a cool section of a heat engine may be cooled by a liquid coolant.

In some embodiments, a cool section of a heat engine may be cooled by water in a supply to an evaporative cooler. For example, evaporative cooler 422 receives water via water inlet 428. In some embodiments, water flowing into a water inlet of an evaporative cooler may pass through a cool section of a heat engine to cool the cool section of the heat engine before arriving at a water inlet of an evaporative cooler. For example, water flowing into water inlet 428 may have passed through a cool section of heat engines 424 and 426 before arriving at water inlet 428. Because an evaporative cooler cools based on the latent heat of evaporation of a fluid (e.g. water), additional heat energy acquired by a fluid prior to arriving at the evaporative cooler, will not significantly affect the outlet temperatures of air being cooled by the evaporative cooler.

FIG. 4 illustrates a particular arrangement of racks in a data center with air inlets and air vents. In some embodiments other arrangements of racks, air inlets, or air vents may be used with a system for reclaiming energy from a cooling system. Ellipses are shown in FIG. 4 to indicate that a data center that includes a system for reclaiming energy from a cooling system, such as data center 400, may include more or less racks in or more or less computer rooms.

Figure 5A:
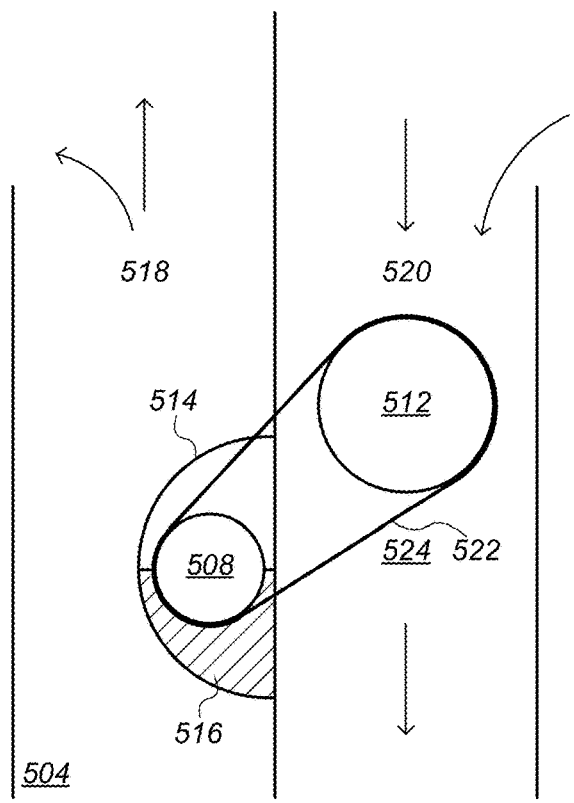
FIG. 5A illustrates a heat engine that is part of a system for reclaiming energy from cooling systems, according to some embodiment.
Figure 5B:
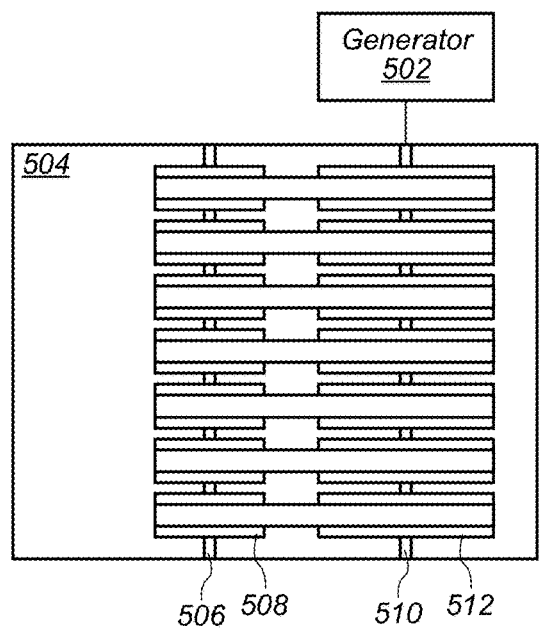
FIG. 5B illustrates a heat engine coupled to a generator that is part of a system for reclaiming energy from cooling systems, according to some embodiments

FIGS. 5A and 5B illustrate a heat engine that includes a shape memory alloy element that is part of a system for reclaiming energy from cooling systems, according to some embodiments. A heat engine and generator such as heat engines and generators, 416, 424, and 425 illustrated in FIG. 4 may include a heat engine and generator such as illustrated in FIGS. 5A and 5B. A heat engine for reclaiming heat energy from a cooling system may be mounted in an exhaust vent and inlet vent of a data center. For example, heat engine 504 is mounted in an exhaust air vent and an inlet air vent. Cool air 520 flows through cool section 524 of heat engine 504. Cool air 520 cools a portion of a shape memory alloy band 522 that is in cool section 524. Also, heated air 518 flows by hot section 514 of heat engine 504 and heats a fluid 516 in hot section 514. As described above, a shape memory alloy band, such as shape memory alloy band 522 may return to a pre-deformation shape (e.g. pre-elongation or pre-stretched length) when heated above an activation temperature in a hot section of a heat engine, such as hot section 514. This may cause a portion of the shape memory alloy band, such as shape memory alloy band 522, that is in a cool section to deform (e.g. elongate or stretch). When the shape memory alloy band recovers to its pre-deformation shape it may exert a force that stretches a portion of the shape memory alloy band that is in a cool section and pulls that portion towards the hot section. This may result in torsional forces that cause discs, such as discs 508 and 512, to rotate.

FIG. 5B illustrates a top view of a heat engine coupled to a generator that is part of a system for reclaiming energy from cooling systems, according to some embodiments. Heat engine 504 illustrated in FIG. 5B may be the same heat engine 504 illustrated in FIG. 5A. A heat engine may include multiple sets of discs and bands coupled to a common shaft that drive a generator. For example multiple sets of discs 508 and 512 and associated bands are coupled to shafts 506 and 510. Shaft 510 is coupled to generator 502. Discs 508 and 512 may rotate due to deformation and recovery of shape memory alloy bands coupled to respective ones of the discs. For example, the deformation and recovery of shape memory alloy bands may cause shafts 506 and 510 to rotate. A generator, such as generator 502, may generate electrical power from the rotation of a shaft, such as shaft 510.

In some embodiments, a cool section of a heat engine, such as cool section 524 of heat engine 504, may be cooled by a liquid, such as feed water to an evaporative cooler as described in regard to FIG. 4.

Figure 6:
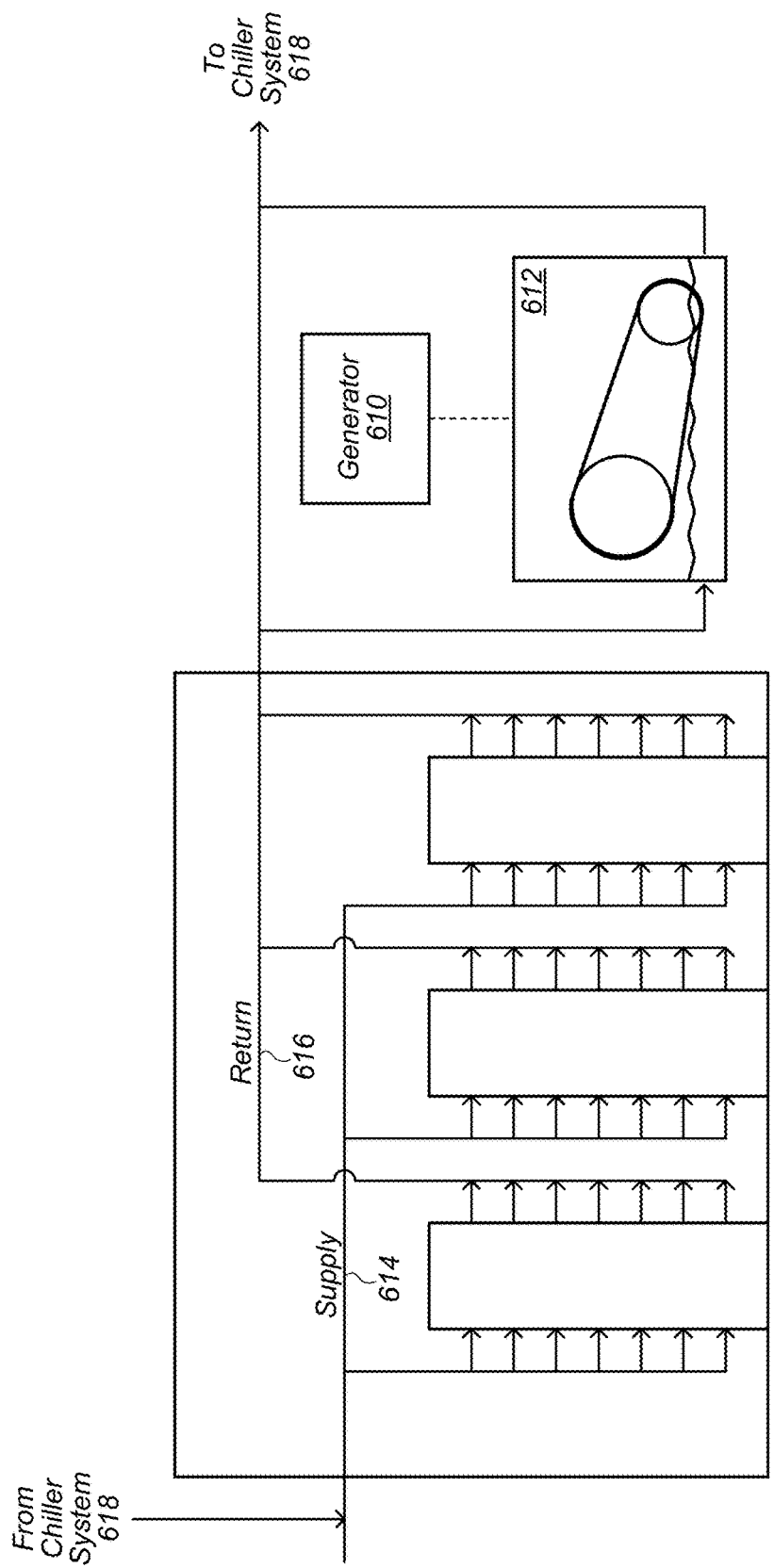
FIG. 6 is a block diagram illustrating a data center that includes a system for reclaiming energy from cooling systems, according to some embodiments.

FIG. 6 illustrates a system for reclaiming heat energy from a cooling system where the cooling system uses a liquid for cooling, according to some embodiments. A heat engine, such as heat engine 612, may generate mechanical work based on a temperature differential between a hot section and a cold section of the heat engine, where the hot section receives heat energy from a liquid flowing in a liquid cooling system. FIG. 6 illustrates a shape memory alloy heat engine (heat engine 612), however heat engine 612 may be a turbine system with a low boiling point working fluid, or other suitable heat engine configured to generate mechanical work based on a temperature differential between a hot section and a cold section of the heat engine. A liquid cooling system may include a cold liquid supply from a chilling system, such as supply 614 from chilling system 618. For example a liquid cooling system may circulate chilled water and the cooling system may include a chiller that lowers the temperature of the circulated chilled water. In some embodiments, other heat transfer liquids may be used such as mineral oil, ethylene glycol, or other suitable heat transfer liquids. A cold liquid may be supplied to heat-producing components mounted in racks to remove heat energy from the heat-producing components. For example, racks may comprise one or more computer devices with heat-producing components and a cold liquid may be used to remove waste heat from the heat-producing components of the computer devices. In some embodiments, a cold liquid may be used to cool air that is then flowed over heat-producing components in computer systems mounted in racks. After cooling heat-producing components mounted in racks, a liquid coolant of a liquid cooling system may be returned to one or more return lines. The return lines may flow back to a chiller system, such as chiller system 618. The chiller system may cool the return liquid coolant and supply the coolant after cooling it to a supply line, such as supply 614. A portion of the liquid coolant that has cooled heat-producing components and consequently been heated by the heat-producing components may be used to heat a hot section of a heat engine. For example, a portion of the heated liquid coolant flowing in return line 616 flows through the hot section of heat engine 612.

A heat engine in a liquid coolant cooling system may function in a similar manner as the heat engines described in regards to FIGS. 1-5. A heat engine in a liquid coolant cooling system may be a turbine with a low boiling point liquid, or other suitable heat engine configured to generate mechanical work based on a temperature differential between a hot section and a cold section.

A heat engine in a liquid coolant cooling system may be coupled to a generator, such as generator 610. A generator in a liquid coolant cooling system may supply electrical power to one or more energy storage devices in a similar manner to the generators described in regards to FIGS. 1-5.

Figure 7:
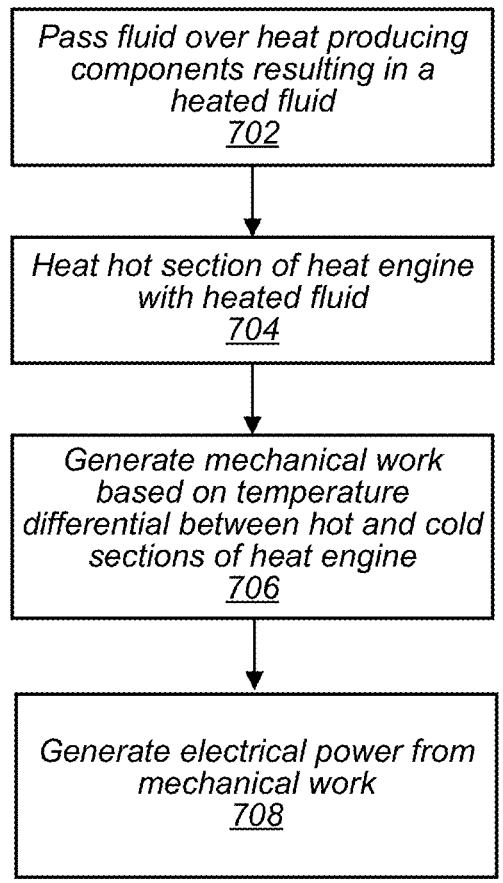
FIG. 7 illustrates use of a system for reclaiming energy from cooling systems, according to some embodiments.

FIG. 7 illustrates use of a system for reclaiming energy from cooling systems, according to some embodiments. At 702 a fluid is passed over heat-producing components resulting in a heated fluid. In some embodiments, the fluid may be air that is passed through heat-producing components of computer devices in a data center by an air handling system. In some embodiments, the fluid may be air that is passed over other heat-producing electronic components by an air handling system. Also, in some embodiments, the fluid may a liquid coolant that is used to cool liquid cooled heat-producing components.

At 704 a hot section of a heat engine is heated by the heated fluid. In some embodiments the heated fluid that has passed over heat-producing components may heat a hot section of a heat engine by passing over the hot section of the heat engine and exchanging heat energy with the hot section of the heat engine. In some embodiments, a heat transfer fluid may pass through a heat exchanger mounted in a flow of the heated fluid that has passed over heat-producing components. Heat energy may be transferred from the heated fluid that has passed over the heat-producing components into a heat transfer fluid in the heat exchanger to heat the heat transfer fluid. The heated heat transfer fluid may circulate to a reservoir that supplies the heated heat transfer fluid to a hot section of a heat engine. In some embodiments, a system for reclaiming energy from a cooling system may include a liquid cooling system and heated liquid coolant may flow through a hot section of a heat engine to heat the hot section of the heat engine.

At 706 mechanical work is generated by a heat engine based on a temperature differential between a hot section and a cold section of the heat engine. The cold section may include ambient air that is at a lower temperature than the hot section. In some embodiments, a cool section may include a flow of ambient air that is drawn into an air intake of a data center. In some embodiments, a cool section of a heat engine may be cooled by a cooling system of a data center, such as a chilled air system or a chilled water system. A heat engine may include a shape memory alloy system that utilizes forces exerted by a shape memory alloy when heated above an activation temperature to generate mechanical work. In some embodiments, a heat engine may be a turbine system that uses a low boiling point working fluid, such as a pressurized refrigerant, such as R-134A or a super-critical fluid, such as carbon dioxide at high pressures. In some embodiments, other heat engines configured to generate mechanical work based on a temperature differential may be used.

At 708, mechanical work generated by the heat engine is used by a generator coupled to the heat engine to generate electricity.

Figure 8:
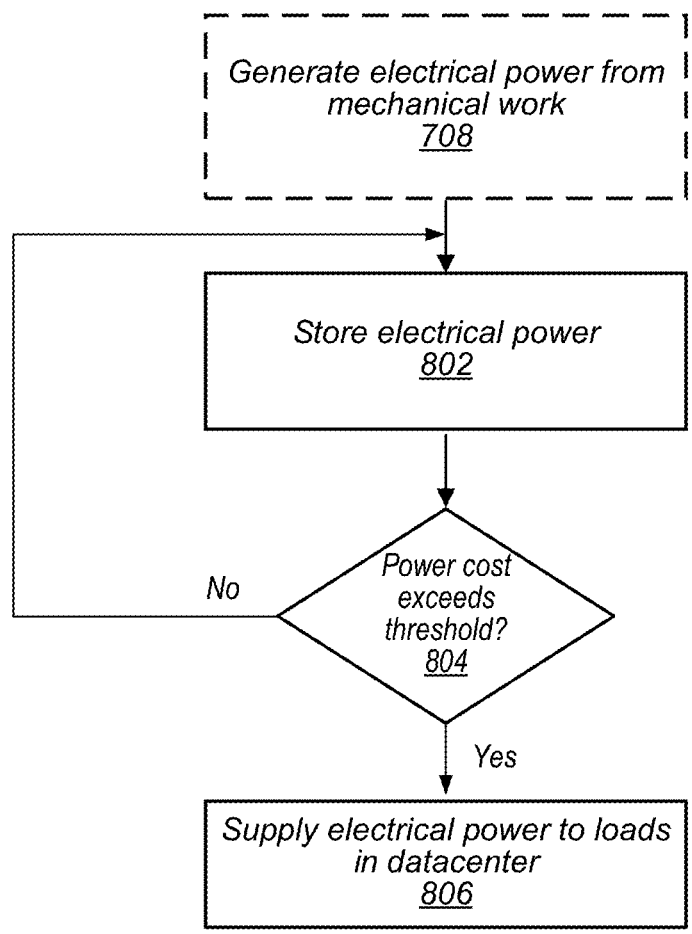
FIG. 8 illustrates use of a system for reclaiming energy from cooling systems that includes an energy storage system, according to some embodiments.

FIG. 8 illustrates use of a system for reclaiming energy from cooling systems that includes an energy storage system, according to some embodiments. After generating electrical power from mechanical work at 706, electrical power may be stored at 802. For example, a system for reclaiming energy from cooling systems may include one or energy storage devices, such as batteries and/or reserve power systems. Energy generated by a system for reclaiming energy from a cooling system may be stored in an energy storage system for later use, such as to supply reserve power in the event of a loss of a primary power system, to supplement an uninterruptible power supply, etc. In some embodiments, electrical power stored in an energy storage system may be used as part of a peak shaving system designs to reduce electrical power consumption and costs during times of peak electrical power usage or pricing. For example, a utility power provider may charge variable prices for electrical power consumed by a data center based on time of day, energy consumption, etc. In order to reduce consumption and ultimately reduce costs of electrical power consumed by a data center from a utility power provider, energy stored in an energy storage system may be used to supplement electrical power received from a utility power provider during intervals of peak power consumption and/or pricing.

At 804, it is determined if power costs exceed a threshold. Power costs may exceed a threshold due to overall power consumption increasing or may exceed a threshold due to peak pricing even though overall power consumption is unchanged from non-peak intervals. If it is determined that power costs do not exceed the threshold, electrical power generated from a system for reclaiming energy from cooling systems is stored and the process reverts to 802. If it is determined that power costs exceed a threshold, electrical power is supplied to loads in a data center at 806 to supplement electrical power received from a utility power provider. By supplementing electrical power received from a utility power provider, the overall amount of electrical power consumed by the datacenter from the utility power provider may be reduced, resulting in a reduction in power costs.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
a plurality of computing devices;
a liquid cooling system configured to move a liquid across heat-producing components in the computing devices;
a heat engine comprising:
a hot section, wherein the hot section is heated by the liquid that has cooled the heat-producing components in the computing devices; and
a cool section at a lower temperature than the hot section,
wherein the heat engine is configured to generate mechanical work based on a temperature differential between the hot section and the cool section of the heat engine;
a generator coupled to the heat engine, wherein the generator is configured to generate electricity from the mechanical work generated by the heat engine; and
an energy storage system comprising one or more energy storage devices electrically coupled to the generator, wherein the energy storage system is configured to:
store the electricity generated by the generator to the one or more energy storage devices; and
selectively supply electrical power from the one or more energy storage devices to the computing devices to supplement electrical power supplied to the computing devices from another source, wherein the electrical power from the one or more energy storage devices is selectively supplied to the computing devices based on one or more conditions in the data center or one or more factors related to the electrical power supplied to the computing device from the other source.

2. The data center of claim 1, wherein the heat engine further comprises:
one or more shape memory elements coupled to a shaft;
wherein the heat engine is configured such that the one or more shape memory elements are deformed when passing through the cool section and recover to a pre-deformation shape when passing through the hot section, wherein a force produced by the one or more shape memory elements recovering to the pre-deformation shape when passing through the hot section causes the shaft to rotate generating the mechanical work.

3. The data center of claim 1, wherein the cool section of the heat engine is air cooled.

4. The data center of claim 1, wherein the cool section of the heat engine is cooled by the liquid cooling system.

5. The data center of claim 1, wherein the heat engine comprises:
a turbine configured to generate the mechanical work.

6. The data center of claim 5, wherein the heat engine comprises a low-boiling point working fluid,
wherein the low-boiling point working fluid changes phases from a liquid phase to a vapor phase in the hot section of the heat engine,
wherein the vapor phase of the low-boiling point working fluid causes a rotor of the turbine to rotate to generate the mechanical work, and
wherein the low-boiling point working fluid is condensed to a liquid phase in the cool section of the heat engine.

7. The data center of claim 6, wherein the low-boiling point working fluid comprises:
a pressurized refrigerant; or
a super-critical fluid.

8. A system comprising;
a liquid cooling system configured to move a liquid across heat-producing components; and
a heat engine comprising:
a hot section, wherein the hot section is heated by the liquid that has removed heat from the heat-producing components; and
a cool section at a lower temperature than the hot section,
wherein the heat engine is configured to generate mechanical work based on a temperature differential between the hot section and the cool section;
a generator coupled to the heat engine, wherein the generator is configured to generate electricity from the mechanical work generated by the heat engine; and
an energy storage system comprising one or more energy storage devices electrically coupled to the generator, wherein the energy storage system is configured to:
store the electricity generated by the generator to the one or more energy storage devices; and
selectively supply electrical power from the one or more energy storage devices to the heat-producing components to supplement electrical power supplied to the heat-producing components from another source, wherein the electrical power from the one or more energy storage devices is selectively supplied to the heat-producing components based on one or more conditions in a facility that includes the heat-producing components or one or more factors related to the electrical power supplied to the heat-producing components from the other source.

9. The system of claim 8, wherein the heat engine comprises one or more shape memory elements coupled to a shaft, and wherein the heat engine is configured such that the one or more shape memory elements are deformed and recover to a pre-deformation shape, wherein a force produced by the one or more shape memory elements recovering to the pre-deformation shape generates the mechanical work.

10. The system of claim 8, wherein the cool section of the heat engine is cooled by the liquid cooling system.

11. The system of claim 8, wherein the heat engine comprises:
a turbine configured to generate the mechanical work.

12. The system of claim 11, wherein the heat engine comprises a low-boiling point working fluid,
wherein the low-boiling point working fluid changes phases from a liquid phase to a vapor phase in the hot section of the heat engine,
wherein the vapor phase of the low-boiling point working fluid causes a rotor of the turbine to rotate, and
wherein the low-boiling point working fluid is condensed to a liquid phase in the cool section of the heat engine.

13. The system of claim 12, wherein the low-boiling point working fluid comprises:
a pressurized refrigerant; or
a super-critical fluid.

14. A method, comprising:
circulating a liquid of a liquid-cooling system across heat-producing components to cool the heat producing components;
heating a hot section of a heat engine, wherein the liquid passed over the heat-producing components is used to heat the hot section of the heat engine, wherein the heat engine comprises the hot section and a cool section at a lower temperature than the hot section; and
generating, by the heat engine, mechanical work, wherein the heat engine is configured to generate the mechanical work based on a temperature differential between the hot section of the heat engine and the cool section of the heat engine;
generating electricity, by a generator coupled to the heat engine;
storing the electricity in one or more energy storage devices; and
selectively supplying electrical power from the one or more energy storage devices to the heat-producing components to supplement electrical power supplied to the heat-producing components from another source, wherein the electrical power from the one or more energy storage devices is selectively supplied to the heat producing components based on one or more conditions in a facility that includes the heat-producing components or one or more factors related to the electrical power supplied to the heat-producing components from the other source.

15. The method of claim 14, further comprising:
generating electrical power from the mechanical work generated by the heat engine.

16. The method of claim 14, wherein generating, by the heat engine, the mechanical work comprises:
generating mechanical work via one or more shape memory elements coupled to a shaft, wherein the heat engine is configured such that the one or more shape memory elements are deformed and recover to a pre-deformation shape, wherein a force produced by the one or more shape memory elements recovering to the pre-deformation shape generates the mechanical work.

17. The method of claim 14, wherein generating, by the heat engine, the mechanical work comprises:
heating a low-boiling point liquid with heat from the hot section of the heat engine such that the low-boiling point liquid changes phases from a liquid to a vapor;
driving a turbine with the vapor; and
condensing the vapor in the cool section of the heat engine.

* * * * *